(12) United States Patent
Kadoike et al.

(10) Patent No.: US 9,756,716 B2
(45) Date of Patent: Sep. 5, 2017

(54) ELECTRONIC ELEMENT AND ELECTRONIC DEVICE

(71) Applicant: DENSO CORPORATION, Kariya, Aichi-pref. (JP)

(72) Inventors: Yuta Kadoike, Kariya (JP); Hideki Kabune, Nagoya (JP); Toshihisa Yamamoto, Anjo (JP)

(73) Assignee: DENSO CORPORATION, Kariya (JP)

( * ) Notice: Subject to any disclaimer, the term of this patent is extended or adjusted under 35 U.S.C. 154(b) by 73 days.

(21) Appl. No.: 14/336,346

(22) Filed: Jul. 21, 2014

(65) Prior Publication Data

US 2015/0029673 A1 Jan. 29, 2015

(30) Foreign Application Priority Data

Jul. 23, 2013 (JP) .................. 2013-152414

(51) Int. Cl.
| | |
|---|---|
| *H05K 1/02* | (2006.01) |
| *H05K 1/18* | (2006.01) |
| *H05K 7/20* | (2006.01) |
| *B62D 5/04* | (2006.01) |
| *H05K 3/28* | (2006.01) |

(52) U.S. Cl.
CPC ......... *H05K 1/0203* (2013.01); *B62D 5/0406* (2013.01); *H05K 1/181* (2013.01); *H05K 7/20454* (2013.01); *H05K 3/284* (2013.01)

(58) Field of Classification Search
CPC .... H05K 1/023; H05K 7/20454; H05K 1/181; H05K 3/284; H05K 7/2039; H05K 7/20463; H05K 7/2049; H05K 7/2089–7/209; H05K 1/0201–1/0203; B62D 5/0406; H01L 23/42; H01L 23/433–23/4334

USPC ................ 361/720, 748, 783, 820, 704–719; 180/65.8; 257/712–713, 706

See application file for complete search history.

(56) References Cited

U.S. PATENT DOCUMENTS

| | | | | |
|---|---|---|---|---|
| 7,208,833 | B2 * | 4/2007 | Nobori | H01L 23/492 |
| | | | | 257/668 |
| 8,198,539 | B2 * | 6/2012 | Otoshi | H01L 23/367 |
| | | | | 165/104.33 |
| 2003/0184969 | A1 | 10/2003 | Itabashi et al. | |

(Continued)

FOREIGN PATENT DOCUMENTS

| | | |
|---|---|---|
| JP | 2002-50722 | 2/2002 |
| JP | 2006-108326 | 4/2006 |

(Continued)

OTHER PUBLICATIONS

Office Action (5 pages) dated May 19, 2015, issued in corresponding Japanese Application No. 2013-152414 and English translation (5 pages).

*Primary Examiner* — Dimary Lopez Cruz
*Assistant Examiner* — Stephen Sul
(74) *Attorney, Agent, or Firm* — Nixon & Vanderhye PC

(57) ABSTRACT

An electronic element surface-mounted on a substrate has a leg part that protrudes from a back surface of the electronic element toward a heat sink along a peripheral portion of a back electrode. As such, if the substrate warps, the protruding leg part abuts a heat reception surface of the heat sink, thereby preserving an insulation gap between the back electrode and the heat sink. As a result, short-circuiting is prevented.

10 Claims, 9 Drawing Sheets

(56) References Cited

U.S. PATENT DOCUMENTS

| | | | |
|---|---|---|---|
| 2004/0233640 A1 | 11/2004 | Itabashi et al. | |
| 2005/0073039 A1* | 4/2005 | Kasuya | H01L 23/49827 257/690 |
| 2006/0177967 A1 | 8/2006 | Muto et al. | |
| 2008/0186751 A1* | 8/2008 | Tokuyama | H01L 23/473 363/131 |
| 2008/0220568 A1 | 9/2008 | Muto et al. | |
| 2008/0310167 A1* | 12/2008 | Zaderej | H05K 3/301 362/294 |
| 2010/0097775 A1* | 4/2010 | Kashiwazaki | H05K 3/284 361/783 |
| 2010/0208427 A1* | 8/2010 | Horiuchi | H05K 7/20927 361/699 |
| 2011/0013370 A1* | 1/2011 | Oota | H01L 23/42 361/752 |
| 2012/0286712 A1 | 11/2012 | Tsuboi et al. | |
| 2013/0215121 A1* | 8/2013 | Guevara | H01L 23/3735 345/501 |

FOREIGN PATENT DOCUMENTS

| | | |
|---|---|---|
| JP | 2011-71550 | 4/2011 |
| JP | 2012-174965 | 9/2012 |

* cited by examiner

ELECTRONIC ELEMENT AND ELECTRONIC DEVICE

CROSS REFERENCE TO RELATED APPLICATION

The present application is based on and claims the benefit of priority of Japanese Patent Application No. 2013-152414, filed on Jul. 23, 2013, the disclosure of which is incorporated herein by reference.

TECHNICAL FIELD

The present disclosure generally relates to an electronic element that is surface-mounted on a substrate, and an electronic device including the electronic element.

BACKGROUND

Conventionally, an electronic device having an electronic element that is surface-mounted on a substrate as a semiconductor package or the like may have a heat sink on an opposite side of the substrate relative to the electronic element. The heat sink may serve as a separation of an electric connection path that connects the electronic element and the substrate from a heat dissipation path for transferring heat to the heat sink from a conductor part on a back-side of the electronic element. A space between the back-side conductor part and the heat sink is filled with a heat conductive material, such as, a gel-like insulation heat dissipater according to a disclosure of a patent document 1 (i.e., Japanese Patent Publication No. JP-A-2002-50722).

A well-known structure for interposing a certain gap between a substrate and a heat sink is, for example, realized as a configuration in which a heat sink is provided with a support part disposed thereon in a protruding shape, on which the substrate is placed and fixed with a screw to the heat sink.

In such a configuration, a distance or insulation gap between the back-side conductor part of the electronic element and the heat sink decreases when the substrate warps toward a heat sink side due to a temperature change, a pitch/interval between two support parts, thickness of the substrate or other causes. The decreased distance, or the decreased amount of the insulation gap, may be smaller than a threshold distance, i.e., a guaranteed insulation distance, of the insulation heat dissipater, thereby leading to a breakage of the electronic element by a zero insulation gap, i.e., a conductive contact or a short circuit between the back-side conductor part and the heat sink.

As a counter-measure for the above, a height management of the electronic element, a solder height management, a warpage management of a substrate, or the like may be performed in a manufacturing process, which may lead to an increased management costs. Alternatively, to assure a sufficient insulation gap during a substrate warped state, a greater distance between the electronic element and the heat sink may be provided together with a greater amount of thickness of the insulation heat dissipater, which in turn deteriorates the heat dissipation characteristics of the electronic element.

SUMMARY

It is an object of the present disclosure to provide a surface-mounted electronic element on a substrate which is configured to dissipate and transfer heat from a backside conductor part of the electronic element to a heat sink via an insulation heat dissipater which includes a "warp-resistant" insulation gap, which ensures that a gap space exists between the backside conductor part and the heat sink even when substrate warpage has occurred.

In the present disclosure, a surface-mounted electronic element on a substrate includes a chip and a substrate side conductor part disposed on a substrate side of the chip in electrical contact with the substrate. The electronic element also includes a backside conductor part disposed on an opposite side of the chip relative to the substrate side conductor part, and exposing a back surface thereof which is opposite to the substrate side conductor part. Additionally, the electronic element includes a molded side part covering a side face of the chip, the substrate side conductor part, and the backside conductor part. Further, the electronic element has a leg part disposed on a peripheral portion of the backside conductor part and protruding from the periphery of the backside conductor part in a direction away from the substrate side conductor part.

In an aspect of the present disclosure, the leg part is integrally molded from resin as one-body with the molded side part.

In yet another aspect of the present disclosure, plural leg parts are formed intermittently along the peripheral portion of the backside conductor part.

Further, in an aspect of the present disclosure, the leg part is formed in a shape of a continuous wall which is disposed along the peripheral portion of the backside conductor part.

Additionally, in the present disclosure, an electronic device includes a heat sink having a heat reception surface and a substrate having a mounting surface on one side of the substrate which faces the heat reception surface, the substrate supported by plural supporters so that a mounting surface is positioned at a predetermined height from the heat reception surface of the heat sink. The electronic device has at least one electronic element surface-mounted on the substrate. The at least one electronic element includes a chip, a substrate side conductor part disposed on a substrate side of the chip in electrical contact with the substrate. The electronic device also has a backside conductor part disposed on an opposite side of the chip relative to the substrate side conductor part, and exposing a back surface thereof which is opposite to the substrate side conductor part. Additionally, the electronic device has a molded side part covering a side face of the chip, the substrate side conductor part, and the backside conductor part, and a leg part disposed on a peripheral portion of the backside conductor part and protruding from the periphery of the backside conductor part in a direction away from the substrate side conductor part. The at least one electronic element is surface-mounted on the substrate with the substrate side conductor part connected to the substrate and the back surface of the backside conductor part facing the heat reception surface of the heat sink. Further, the electronic device includes an insulation heat dissipater filled within a space between the backside conductor part and the heat reception surface of the heat sink and transmitting heat generated by the electronic element to the heat sink.

In a further aspect of the present disclosure, the electronic device is installed in a motor drive circuit that drives a motor that outputs a steering assist torque in an electric power steering apparatus of a vehicle.

The electronic element of the present disclosure may be a switching element, such as a MOSFET etc. used for a power circuit, for example. When the MOSFET is surface-mounted onto a substrate, a heat dissipation configuration for dissipating and transferring heat from such a heat-generating electronic element may be provided as a heat dissipation path from a backside conductor part such as a source electrode or the like to a heat sink via an insulation heat dissipater. In the present disclosure, such a heat dissipation path of the electronic element is supported by an insulation leg part disposed at a periphery portion of the backside conductive part, which provides a support for supporting a heat reception surface of the heat sink.

In the electronic device containing such an electronic element, the surface mount of the electronic element that mounts the element onto a mounting surface of the substrate is performed so that an exposed backside of the backside conductor part faces the heat reception surface of the heat sink. The substrate is supported by plural supporters so that a predetermined interval is interposed between the substrate and the heat reception surface of the heat sink. A space between the backside conductor part of the electronic element and the heat sink is filled with an insulation heat dissipater which is capable of transferring heat to the heat sink during a heat generation time of the electronic element, i.e., heat from the electronic element caused by receiving an electric power from a power source. Since the electronic element is provided with a leg part, when warpage and bending of the substrate supported by the supporters, which serve as a fulcrum of such warpage and bending, is caused toward a heat sink side, the leg part firstly abuts on the heat reception surface prior to an abutment on the backside conductor part to such surface. Therefore, an insulation gap between the backside conductor part and the heat sink is secured, and a breakage of the electronic element due to a short circuit is prevented.

The present disclosure may be provided as a package of an electronic element according to the above-mentioned configuration, or may be provided as an electronic device including such an electronic element, a substrate, a heat sink, and an insulation heat dissipater.

As an electronic element of the present disclosure, the leg part may preferably be provided as a one-body structure of a resin mold together with the molded side part. In such manner, a production efficiency of the electronic element is improved. The leg part may be formed "intermittently" as plural parts surrounding the backside conductor part, or may be formed as a continuous wall around it. In an "intermittent" configuration, the insulation heat dissipater between the plural leg parts contributes to good heat dissipation characteristics. In a continuous wall configuration, since the reactive force from the warpage of the substrate is distributed over the entire wall, the deformation or breakage of the wall shape leg part is prevented.

The electronic element of the present disclosure is applied suitably to a motor drive circuit which drives a motor that outputs a steering assist torque in an electric power steering device of vehicles, for example. Such a motor drive circuit may include an inverter circuit which drives a three-phase alternating current brush loess motor, an H-bridge circuit which drives a DC motor having a brush or the like.

A drive circuit used in vehicles generally has a very demanding volume reduction request for coping with a limitation of the device installation space, which prevents the use of a sufficient number of supporters for supporting the heat sink. Therefore, the pitch between supporters tends to be longer than a desired pitch that is desirable for the thickness of the substrate. Further, for an output of a high power torque, the drive circuit of the steering assist motor generates a relatively large amount of heat from its switching element, which serves as a motivation to minimize a distance between the backside conductor part and the heat sink as much as possible, for the improvement of the heat dissipation characteristics.

Therefore, by applying the electronic element of the present disclosure to a drive circuit of a steering assist motor in an electric power steering device, a practical effect of the present disclosure, which enables a configuration in which an excessive distance between the backside conductor part and the heat sink is avoided (i.e., an overly-thick insulation heat dissipater is prevented) and an insulation gap is preserved between the heat sink and a warped substrate that is warped towards the heat sink.

BRIEF DESCRIPTION OF THE DRAWINGS

Other objects, features and advantages of the present disclosure will become more apparent from the following detailed description disposed with reference to the accompanying drawings, in which.

DETAILED DESCRIPTION

Hereafter, an electronic element and an electronic device including the electronic element are described as an embodiment of the present disclosure, with reference to the drawings. As a start of the description, an electric power steering apparatus to which the electronic element of the present embodiment in the present disclosure is applied is described with reference to FIG. 2.

Figure 2:
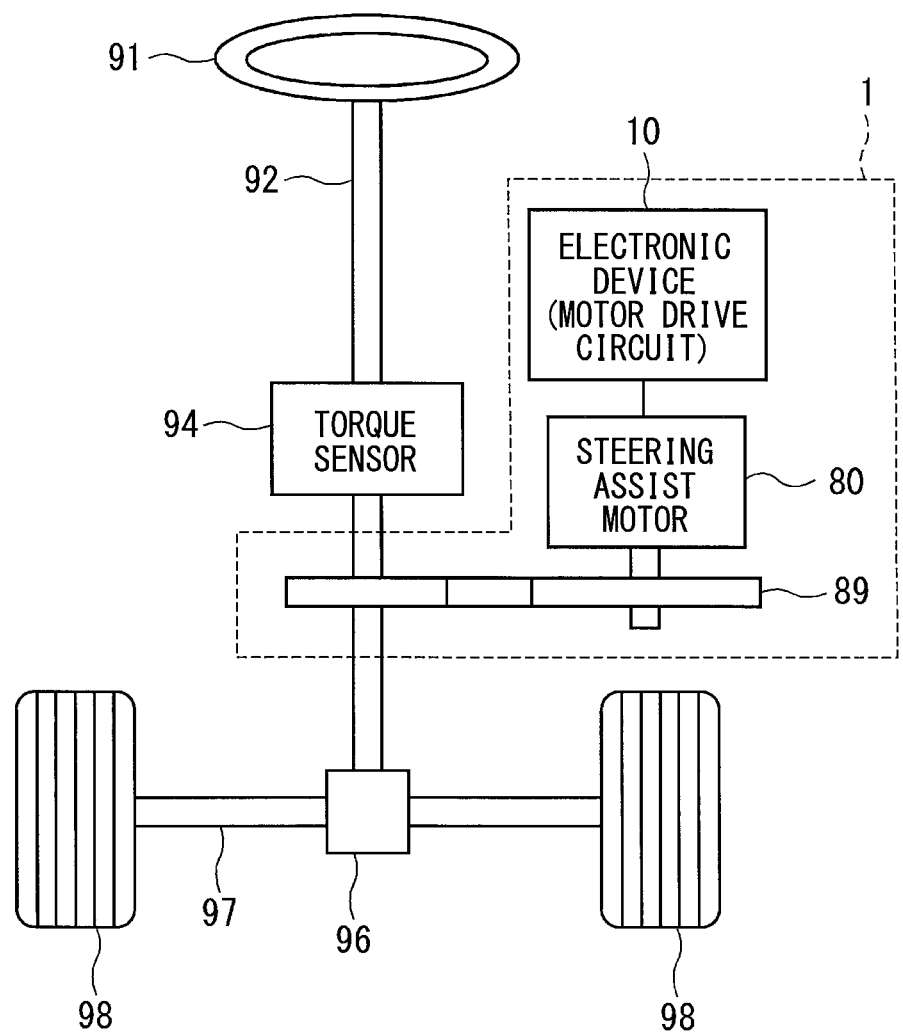
FIG. 2 is an illustrative diagram of an electric power steering apparatus in which an electronic device according to an embodiment of the present disclosure is used.

As shown in FIG. 2, an electric power steering apparatus 1 provides, to a steering shaft 92, a steering assist torque for assisting a steering torque of a driver. On the steering shaft 92 connected to a steering wheel 91, a torque sensor 94 for detecting a steering torque is disposed. At a tip of the steering shaft 92, a pinion gear 96 is disposed, and the pinion gear 96 engages a rack shaft 97. On both ends of the rack shaft 97, a pair of wheels 98 is rotatably connected via a tie rod or the like. A rotational movement of the steering shaft 92 is converted into a straight movement of the rack shaft 97 by the pinion gear 96, and the pair of wheels 98 is steered according to an angle that is proportional to the movement of the rack shaft 97.

The electric power steering apparatus 1 comprises a steering assist motor 80, a speed reduction gear 89 which reduces a speed of rotation of the motor 80 and transmits the rotation to the steering shaft 92, and an electronic device 10 which drives the motor 80.

Thus, the electronic device 10 is implemented as a motor drive circuit which drives the steering assist motor 80 in the electric power steering apparatus 1.

For example, when the motor 80 is a three-phase alternating current brush-less motor, the electronic device 10 is a three-phase inverter circuit, and when the motor 80 is a DC motor having a brush, the electronic device 10 is an H-bridge circuit. The number of the inverter circuits or the H-bridge circuits may be only one system, or may be two or more systems for redundancy that provides fail-safe characteristics for the electronic device 10 at the time of the device failure.

The above-described circuits include a switching element which turns a power circuit ON and OFF. For example, in the three-phase inverter circuit, a bridge connection of the six switching elements per one system is provided, and in the H-bridge circuit, a bridge connection of the four switching elements per one system is provided. Further, the switching element may be provided on an input side of a circuit as a power supply relay, or the switching element may be provided on a motor 80 side of a circuit as a motor relay.

In such configuration, the switching element used in the inverter circuit or in the H-bridge circuit dissipates a larger amount of heat, the electronic device including such an electronic element is required to have good heat dissipation characteristics. As an implementation configuration for mounting such an electronic element on a substrate, two configurations are mainly used, i.e., (i) a through-hole type element is attached onto a heat sink by using a screw with an insulation sheet interposed therebetween, and (ii) a surface-mount type element is attached onto a heat sink with a substrate which is made of glass epoxy or ceramics through which heat is dissipated thereto.

The through-hole type configuration in which a through-hole type element is attached onto a heat sink is disclosed, for example, in a patent publication of a Japanese application laid open as JP-A-2012-244637. This configuration is problematic for the following two points, i.e., (i) a man-hour for an insertion work for inserting a lead terminal into a hole of a substrate and (ii) an increase of an area side of the substrate for the connection of the lead terminal thereonto.

On the other hand, the surface-mount type configuration in which a surface-mount type element dissipates heat through the substrate to the heat sink is also problematic because, in such a configuration, heat dissipation effects are not sufficient.

Therefore, as disclosed in the above-described patent document 1, a heat dissipation configuration in which heat is dissipated from a surface-mount type electronic element from a backside conductive part on an opposite side of the element relative to the substrate via an insulation heat dissipater to a heat sink, effectively improves the heat dissipation characteristics and effectively reduces a volume size of the electronic device.

Therefore, by the electronic element of the present embodiment, such a configuration in which "an excessive distance between the backside conductor part and the heat sink is avoided (i.e., an overly-thick insulation heat dissipater is prevented) and an insulation gap is preserved between the heat sink and a warping substrate that is warped toward the heat sink.

Hereafter, plural embodiments of the electronic element regarding the present disclosure are described in detail.

First Embodiment

Figure 1A:
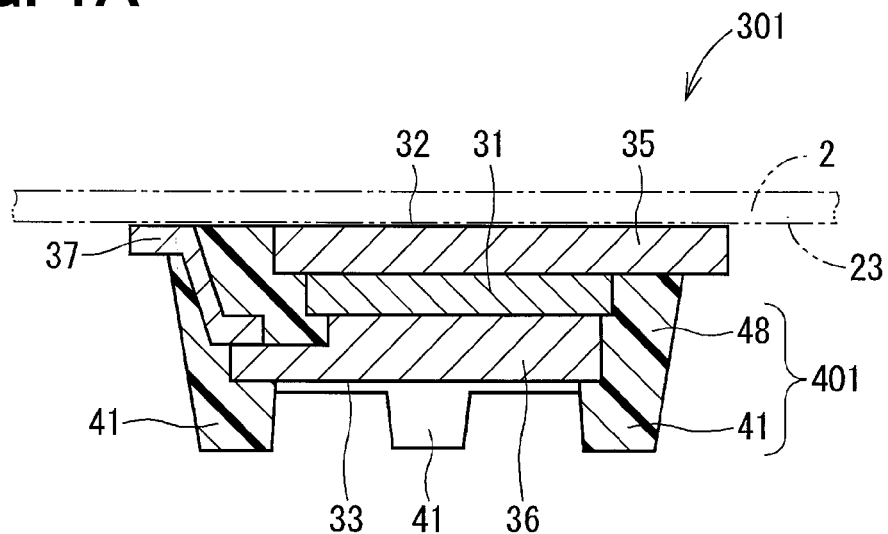
FIG. 1A is an illustrative cross section of an electronic element in a first embodiment of the present disclosure.
Figure 1B:
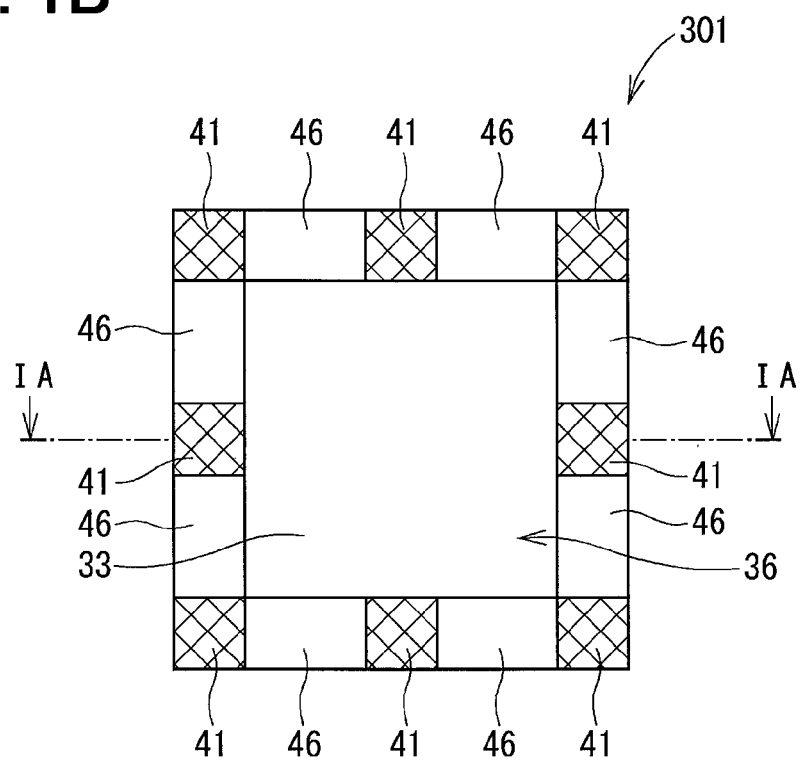
FIG. 1B is an illustrative bottom view of the electronic element in the first embodiment of the present disclosure.

A configuration of an electronic element 301 in the first embodiment of the present disclosure is described with reference to an illustration of a cross section in FIG. 1A, and to a bottom view in FIG. 1B. FIG. 1A is a cross section along a line IA in FIG. 1B. A cross-hatching area in the bottom view of FIG. 1B is a lower end surface of a leg part 41. Further, omitted from the illustration in FIG. 1B are protrusion parts such as a drain terminal 35 and a source terminal 37 which should otherwise appear in the bottom view. The same omission applies to the view in each of FIGS. 5A and B, and FIG. 6B.

As shown in FIG. 1A, the electronic element 301 includes a chip 31, a drain terminal 35 serving as a "substrate side conductor part", a back electrode 36 serving as a "backside conductor part", a source terminal 37, and a one-body mold resin 401 that is formed as a one-body mold of a molded side part 48 and a leg part 41. That is, the molded side part 48 and the leg part 41 may be formed as a single body.

The electronic element 301 of the present embodiment is a resin mold package of MOSFET (i.e., Metal Oxide Semiconductor Field-Effect Transistor) that serves as a semiconductor switching element. The chip 31 which is an electronic element itself controls a turn ON and a turn OFF of the electric power between a source and a drain according to an input of a control signal into a gate. In FIG. 1A, the drain terminal 35 is electrically connected to an upside of the chip 31, and the back electrode 36 is electrically connected to a downside of the chip 31.

The source terminal 37 is electrically connected to the back electrode 36. Therefore, the back electrode 36 may also be designated as a "source electrode 36".

An opposite end face of the drain terminal 35 which is opposite to the chip 31 is designated as a base surface 32, and an opposite end face of the back electrode 36 which is opposite to the chip 31 is designated as a back surface 33. The electronic element 301 is surface-mounted onto a mount surface 23 of a substrate 2, which is drawn by a dotted broken line, by a base surface 32 side of the element 301. That is, in other words, the drain terminal 35 and the source terminal 37 in FIG. 1A are electrically connected to the substrate 2 with soldering. Further, the back surface 33 of the back electrode 36 is exposed as a metal surface.

The molded side part 48 of the one-body mold resin 401 is a part that covers a side face of the chip 31, the drain terminal 35, and the back electrode 36 for insulation of those parts. The leg part 41 which is molded as one body with the molded side part 48 projects from the back surface 33 in a periphery portion of the back electrode 36 towards an opposite direction relative to the drain terminal 35.

According to the present embodiment, in the periphery portion of a square shape of the back electrode 36, a total of eight leg parts 41 are intermittently formed at the four corners and around the center of the back electrode 36. Between the two adjacent leg parts 41, a concave part 46 is provided, as seen in the bottom view (of FIG. 1B). In the present embodiment, the number of the leg parts 41 is chosen to provide a "balanced" arrangement of the legs. However, the number of the leg parts 41 is not limited to such a configuration, and the leg part 41 may be freely arranged in the number, in the shape, and the like.

Figure 4:
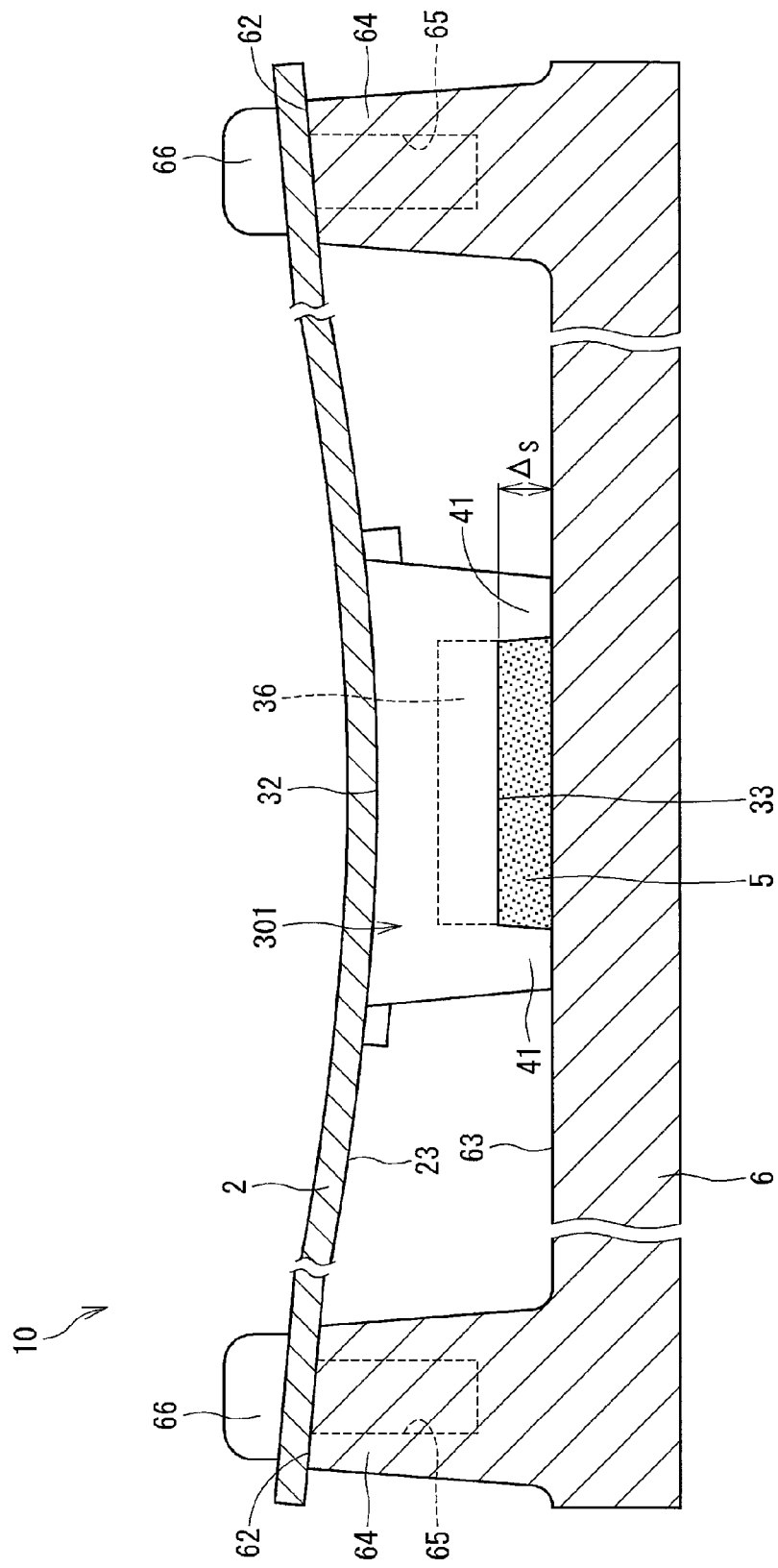
FIG. 4 is an illustrative cross section of the electronic device of FIG. 3 in which a substrate is in a warped state.

Next, the configuration of the electronic element including the electronic element 301 is described with reference to FIG. 4. The electronic device 10 shown in FIG. 4 is a device which constitutes a motor drive circuit, such as an inverter circuit and an H-bridge circuit, as mentioned above. The electronic device 10 is provided with a heat sink 6, the substrate 2, the electronic element 301, and a heat dissipation gel 5 which serves as "an insulation heat dissipater".

The heat sink 6 is made of aluminum, and has a flat heat reception surface 63 in an area that at least faces the electronic element 301. The heat sink 6 also has plural column-shape support parts 64 respectively having a support surface 62 at a higher position that is higher than the heat reception surface 63. The support surface 62 on each of the support parts 64 is disposed to have the same height, and, on each of the support parts 64, a screw hole 65 into which a screw 66 is screwed is formed.

The substrate 2 is fixed onto the support part 64 of the heat sink 6 with the screw 66 so that the mount surface 23 which is one of two sides of the substrate 2 faces the heat reception surface 63 of the heat sink 6 at a predetermined distance. The base surface 32 side of the electronic element 301 is soldered to the mount surface 23 of the substrate 2. Therefore, the back surface 33 of the electronic element 301 inevitably faces the heat reception surface 63 of the heat sink 6.

A space between the back surface 33 of the back electrode 36 and the heat reception surface 63 of the heat sink 6 is filled with the heat dissipation gel 5. The heat dissipation gel 5 is a heat conductive material which uses silicone as its main ingredient, for example, and can conduct heat to the heat sink 6 which is generated by the electronic element 301 at the time of receiving the electric power. Further, the heat dissipation gel 5 is also filled in a space between the heat reception surface 63 and the end face of the leg part 41 that is disposed in the periphery portion of the back electrode 36. In the illustration, the heat dissipation gel 5 is depicted as a pearskin pattern.

Since the heat dissipation gel 5 has a relatively high electrical resistance, which means substantially insulating but slightly conductive. Therefore, the gel 5 has to have a thickness that is equal to or greater than a guaranteed insulation distance (i.e., threshold distance) depending on the required insulation voltage. Therefore, a relationship between the height of the electronic element 301 and the height of the support part 64 is set up so that an insulation gap $\Delta 0$, which is a distance between the back surface 33 of the back electrode 36 and the heat reception surface 63 of the heat sink 6, is provided to be equal to or greater than the guaranteed insulation distance when the substrate 2 is attached onto the support part 64.

Figure 3:
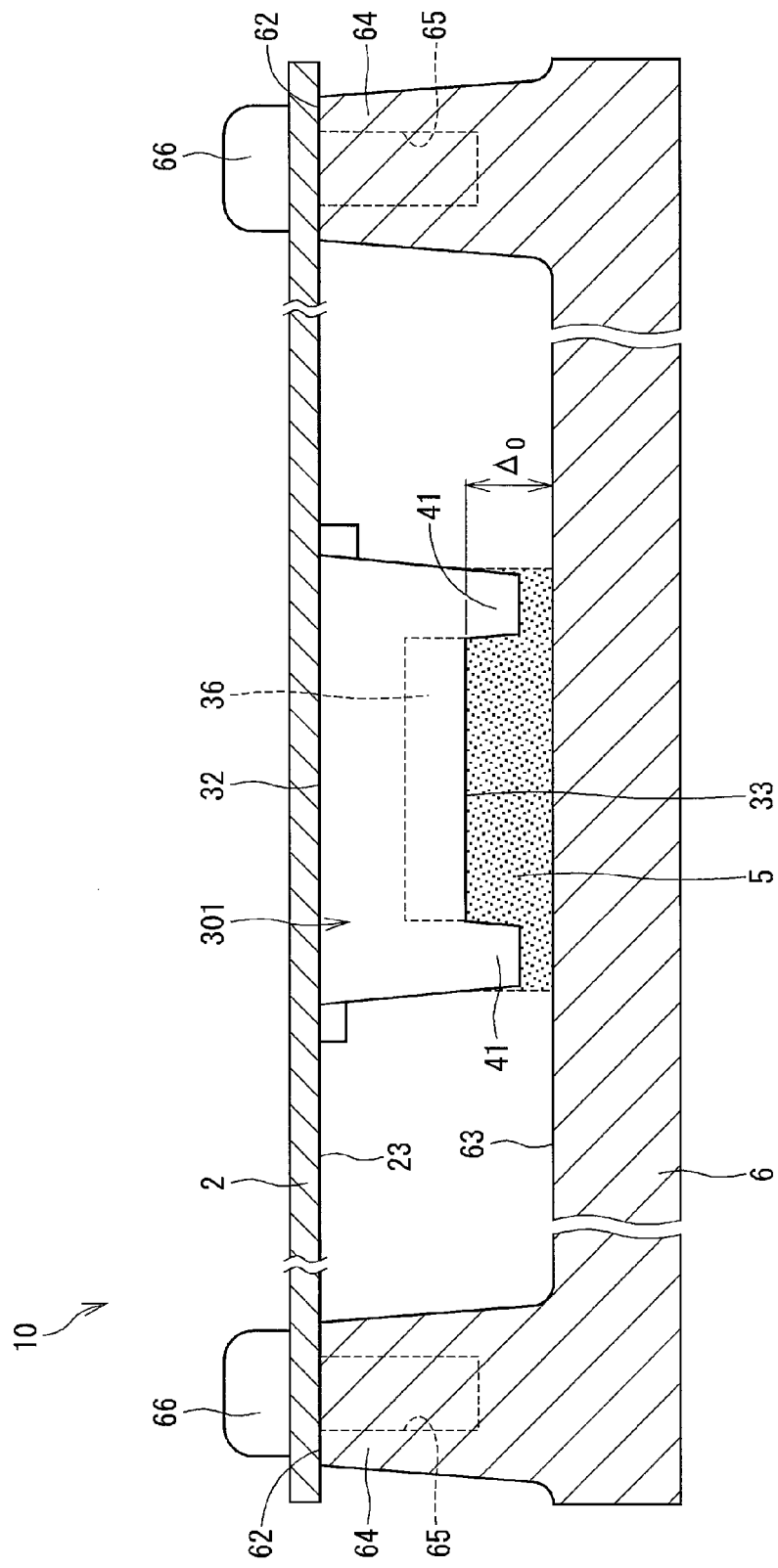
FIG. 3 is an illustrative cross section of the electronic device containing the electronic element in the first embodiment of the present disclosure.

As shown in FIG. 3, when the substrate 2 is attached to the support part 64, the substrate 2 is a straight-flat shape and is supported in parallel with the heat reception surface 63. Such a state is designated as a normal state. That is, the above-mentioned insulation gap $\Delta 0$ is "an insulation gap $\Delta 0$ in the normal state".

However, during a use of the electronic device 10, the substrate 2 may be warped by a temperature change etc. The present disclosure specifically focuses on warpage of the substrate 2 toward a heat sink side, i.e., toward the heat sink 6. The effectiveness of the present disclosure is described in more detail in the following.

(Effectiveness)

The effectiveness of the electronic element 301 of the present embodiment is described in contrast to the electronic element in a comparative example.

Figure 8:
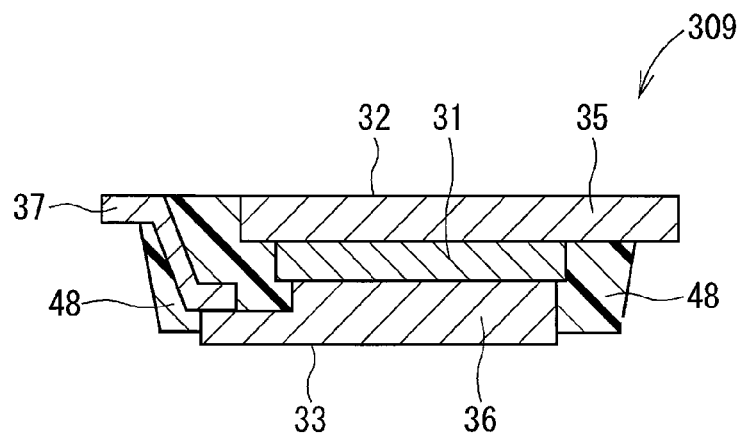
FIG. 8 is an illustrative cross section of the electronic element of a comparative example.
Figure 9:
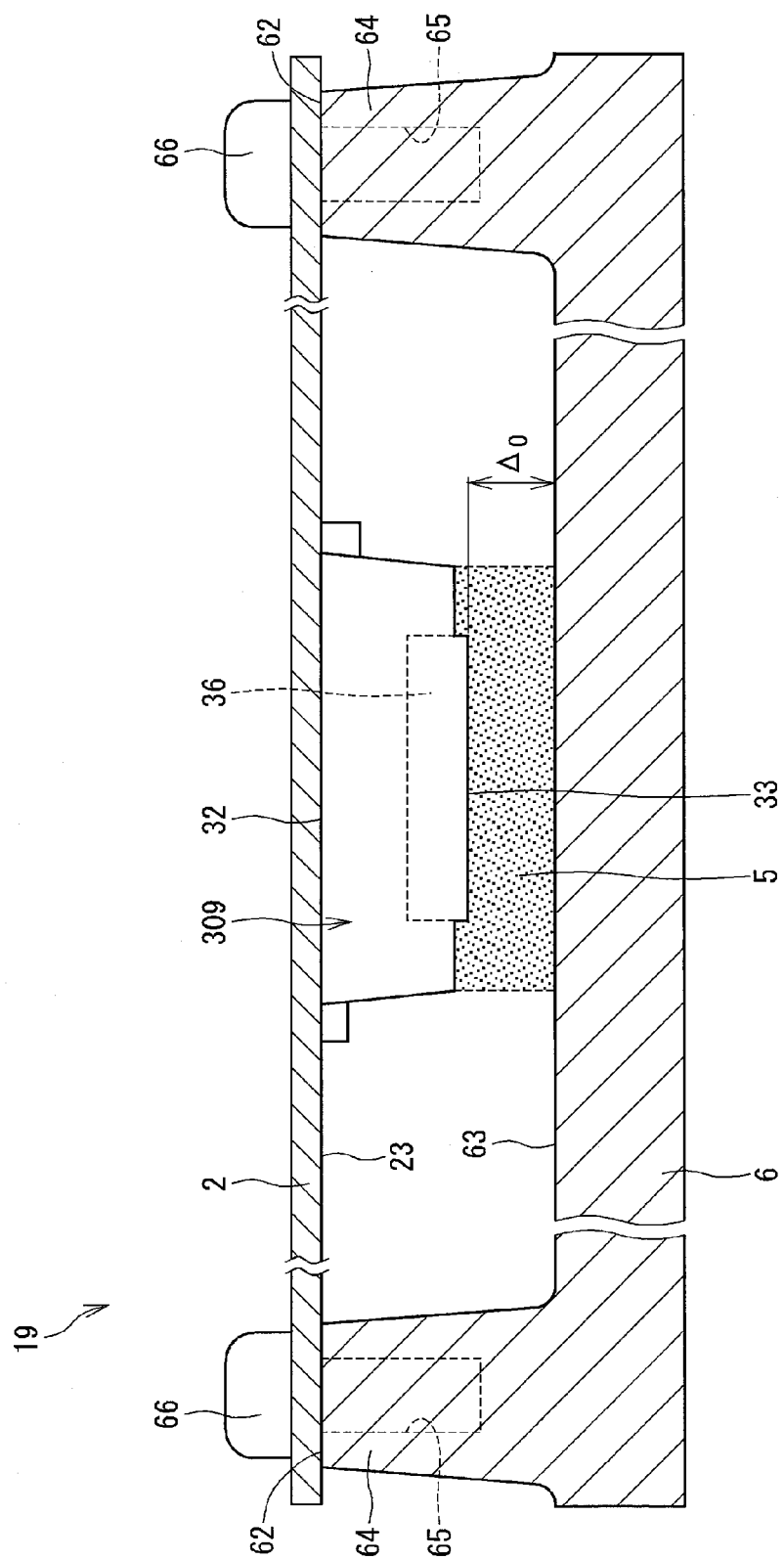
FIG. 9 is an illustrative cross section of the electronic element containing the electronic element of the comparative example.
Figure 10:
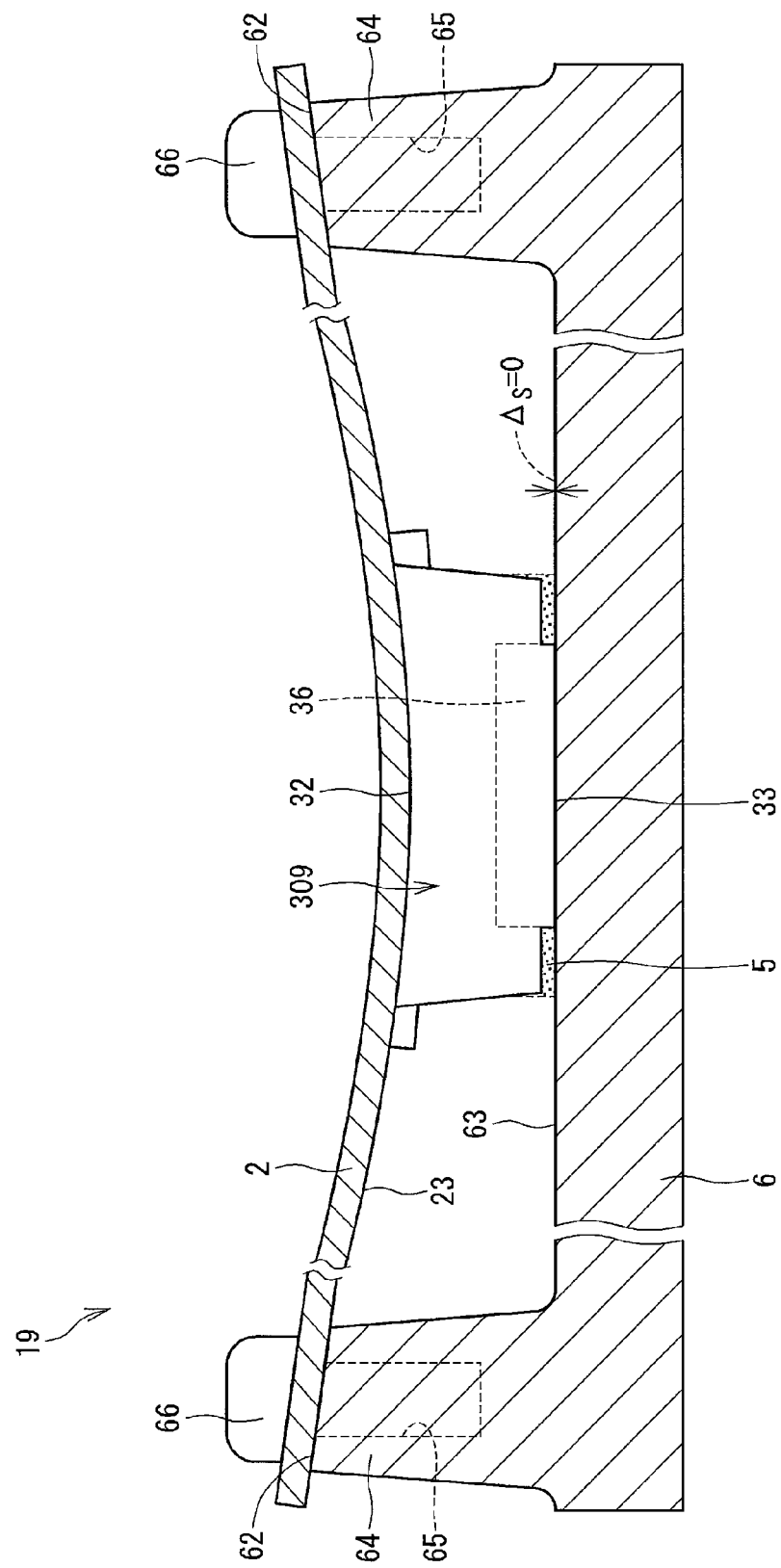
FIG. 10 is an illustrative cross section of the electronic device of FIG. 9 in which a substrate is in a warped state.

(1) How the electronic element and the electronic device of the present embodiment are more effective than the electronic element and the electronic device in a comparative example in FIGS. 8-10 is described in the following.

That is, as shown in FIG. 8, an electronic element 309 in the comparative example has substantially the same configuration as the electronic element 301 of the present embodiment except for a point that the element 309 does not have the leg part 41. Further, as shown in FIG. 9, an electronic device 19 including an electronic element 309 is structured to have "an insulation gap $\Delta 0$ in the normal state" that is substantially the same dimension as the one in FIG. 3 of the present embodiment when the substrate 2 is supported in a straight-flat condition. The insulation gap $\Delta 0$ is filled with the heat dissipation gel 5, and the heat generated by the electronic element 309 is transferable to the heat sink 6.

However, as shown in FIG. 10, when the substrate 2 warps toward one side and moves closer to the heat sink 6 due to a temperature change etc., the electronic element 309 moves downward towards the heat sink 6 and pushes the fluid heat dissipation gel 5 away, thereby (i) diminishing "an insulation gap $\Delta s$ in a substrate warping state" and (ii) allowing the back electrode 36 to contact the heat reception surface 63, i.e., when the gap $\Delta s$ becomes zero. As a result, the electronic element 309 may be short circuited due to the breakdown of insulation therebetween.

On the other hand, the electronic element 301 of the present embodiment is, as shown in FIG. 4, insulation-proof when the substrate 2 warps toward the heat sink 6, because the leg part 41 of the electronic element 301 abuts on the heat reception surface 63 before the back electrode 36 contacts the heat reception surface 63. That is, in other words, the leg part 41 functions as a "support" between the back electrode 36 and the heat reception surface 63. Therefore, a projection amount of the leg part 41 from the back surface 33 of the back electrode 36, i.e., the height of the leg part 41, is secured as "an insulation gap $\Delta s$ in a substrate warping state". Thus, by setting the height of the leg part 41, i.e., "an insulation gap $\Delta s$ in a substrate warping state", to be equal to or greater than the guaranteed insulation distance (i.e., threshold distance) of the heat dissipation gel 5, good insulation characteristics of the electronic device 10 are realized, in addition to prevention of short circuiting that is caused by the contact between the back electrode 36 and the heat reception surface 63.

Further, such a configuration is also beneficial and effective, since it prevents the heat dissipation gel 5 from having an overly-thick dimension for the purpose of securing a sufficient insulation gap at a time of warpage of the substrate 2, thereby preventing the deterioration of the heat dissipation characteristics.

(2) Since the insulation of the electronic device 10 is securable by disposing the leg part 41 as mentioned above, there is no need to perform various kinds of strict management in a manufacturing process, such as a height management of the electronic element 301, a solder height management, a warpage management of the substrate 2, or the like. Therefore, management costs and management items are both reduced.

Further, the reduced/minimized distance between the electronic element 301 and the heat sink 6 contributes to a volume reduction of the electronic device 10.

(3) By reducing the thickness of the heat dissipation gel 5 to the minimum, the amount of the heat dissipation gel 5 is reduced. Further and more importantly, the reduced thickness of the heat dissipation gel 5 enables a replacement of a high grade gel 5 with a low- or mid-grade gel 5, because the low/medium grade heat dissipation gel 5 and the high grade gel 5 provide substantially the same effectiveness in a reduced thickness. That is, the cost of the gel 5 is reduced, and therefore, the cost of the electronic device 10 is reduced.

(4) According to the present embodiment, the leg part 41 is realized as a part of the one-body mold part 401, together with the molded side part 48. Therefore, a dedicated process only for forming the leg part 41 becomes unnecessary, and production efficiency is improved.

(5) According to the present embodiment, plural leg parts 41 are intermittently formed in a periphery portion of the back electrode 36, thereby providing the concave part 46 between two leg parts 41. Therefore, the heat from the electronic element 301 is still transferable to the heat sink 6 via heat dissipation gel 5 that fills a space between the concave parts 46 even when the substrate 2 warps toward the heat sink 6 and the gap space between the leg part 41 and the heat reception surface 63 decreases. Therefore, good heat dissipation characteristics are maintained even if the substrate warps.

(6) The electronic device 10 including the electronic element 301 in the present embodiment is used in a drive circuit of the steering assist motor 80 in the electric power steering apparatus 1.

In general, the drive circuit in vehicles must be limited in size due to the limitation of the device installation space, which prevents the forming of a sufficient number of support parts 64 on the heat sink 6.

Therefore, the pitch between the support parts 64 tends to be longer than a desired pitch that is desired by the thickness of the substrate 2. Further, for an output of a high power torque, the drive circuit of the steering assist motor 80 generates a relatively large amount of heat from its switching element, which provides an incentive to minimize a distance between the back electrode 36 and the heat sink 6 as much as possible, for the improvement of the heat dissipation characteristics.

Therefore, an insulation gap Δs is provided by the support of the leg part 41 when the substrate warps toward the heat sink 6 while avoiding the need for an overly-large insulation gap Δ0 between the back electrode 36 of the electronic element 301 and the heat sink 6 that is mounted on the straight-flat shaped substrate 2.

In the following, the second to fifth embodiments describe a variation of leg part configurations of the electronic device with reference to FIG. 5 to FIG. 7. Like parts in the following embodiments have like numbers as in FIG. 1, and redundant description of such parts is saved.

Second Embodiment

Figure 5A:
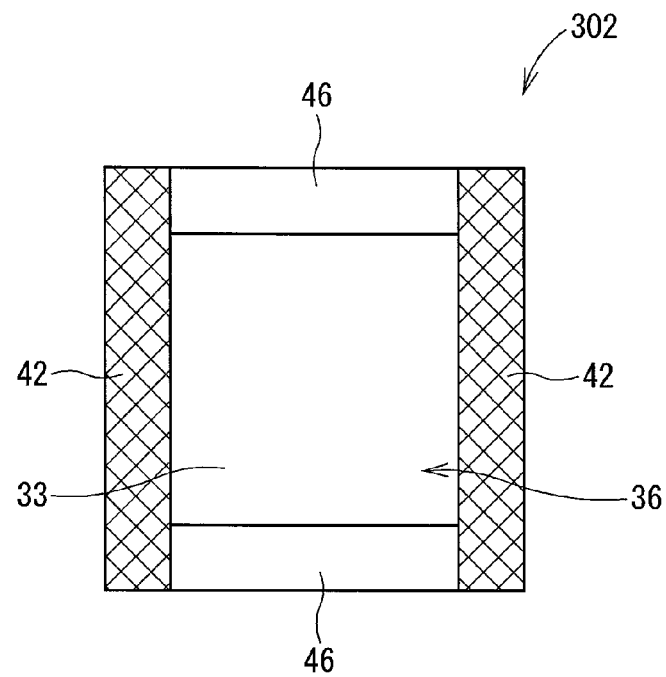
FIG. 5A is a bottom view of the electronic element in a second embodiment of the present disclosure.

As shown in a bottom view of FIG. 5A, an electronic element 302 of the second embodiment has two rows of a leg part 42, one of two leg parts 42 arranged along a right side of the back electrode 36 and the other one of the two leg parts 42 along a left side thereof. The leg part 42 is resin-molded as a part of the molded side part 48 similar to the first embodiment. An upper side and a lower side of the back electrode 36, along which no leg part 42 is formed, are provided as the concave part 46. That is, the number of the "intermittently-formed leg parts" may be a minimum of two.

According to the second embodiment, the same effects as the first embodiment are achieved.

Third Embodiment

Figure 5B:
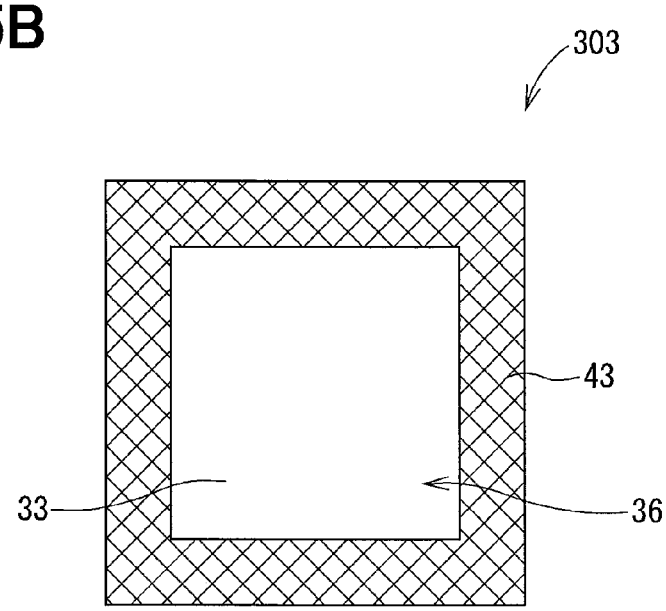
FIG. 5B is a bottom view of the electronic element in a third embodiment of the present disclosure.

As shown in a bottom view of FIG. 5B, an electronic element 303 of the third embodiment has a leg part 43 in a continuous wall shape formed along all four sides of the back electrode 36. The leg part 43 is formed as one-body resin mold as a part of the molded side part 48 similar to the first and second embodiments.

If the substrate 2 warps to a degree in which the leg part 43 abuts on the heat reception surface 63 of the heat sink 6 in the configuration of the third embodiment, a lower end surface of the frame-shape leg part 43 abuts on the heat reception surface 63. Such a structure of the third embodiment is more beneficial than the configuration in the first and second embodiments, in which the leg parts 41 and 42 are provided as an intermittent part, in terms of more dispersedly receiving a reactive force by the wall-shape leg part 43 and preventing breakage/deformation of the leg part 43.

Fourth Embodiment

An electronic element 304 in the fourth embodiment shown in FIG. 6 has a frame-shape leg part 44, which is positioned away, i.e., outwardly, from a periphery of the back electrode 36 by a certain distance, in comparison to the frame-shape leg part 43 in the third embodiment. By providing a certain dimensional margin, a positioning accuracy of an insertion component for the resin-molding of a one-body mold part 404 is made less demanding, for example.

Figure 6A:
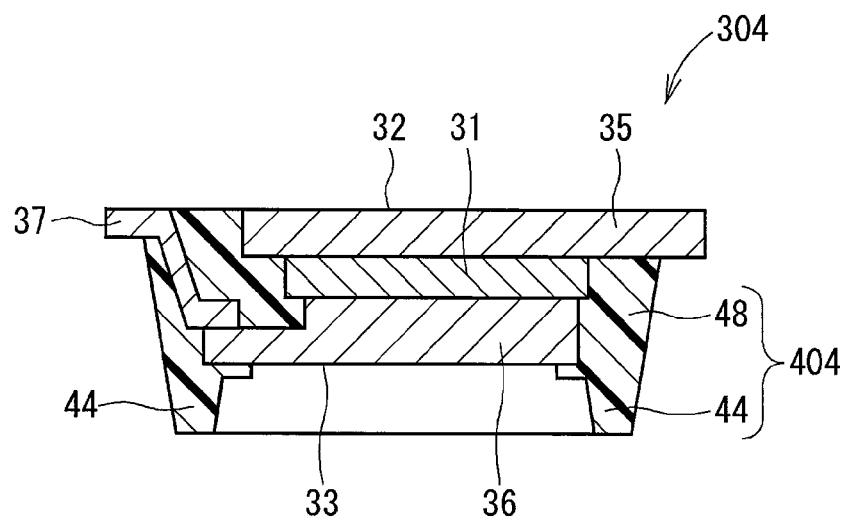
FIG. 6A is an illustrative cross section of an electronic element in a fourth embodiment of the present disclosure.
Figure 6B:
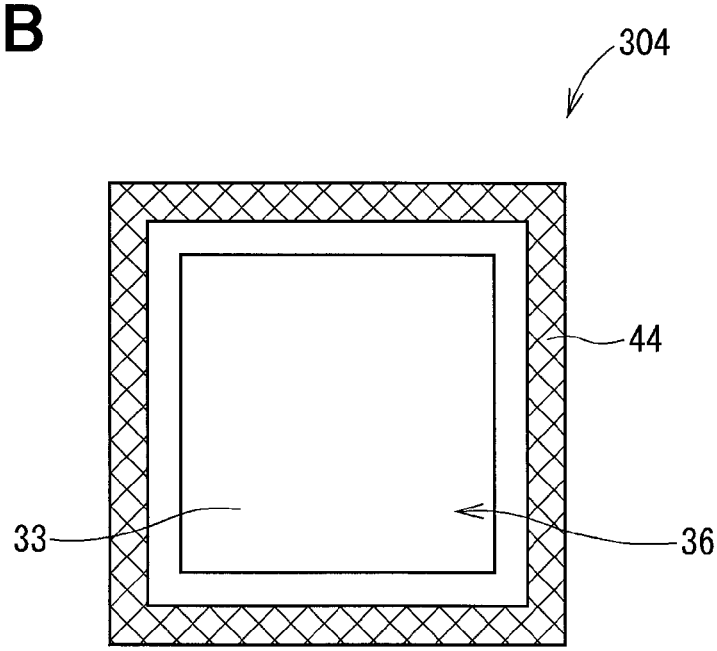
FIG. 6B is an illustrative bottom view of an electronic element in the fourth embodiment of the present disclosure.

As practically shown in the above, "a peripheral portion of a backside conductor part" in the claims may be interpreted as not only on or within the periphery of the back electrode 36 but may also include a position beyond the periphery of the electrode 36 (i.e., outside of the footprint of the back electrode 36), as shown in FIGS. 6A and 6B, which is within a reasonable scope of the directly-peripheral position according to the common general technical knowledge.

Fifth Embodiment

Figure 7:
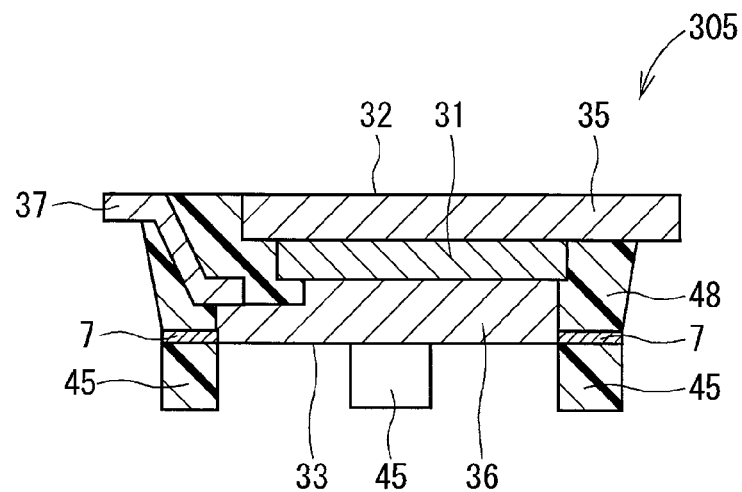
FIG. 7 is an illustrative cross section of the electronic element in a fifth embodiment of the present disclosure.

As shown in FIG. 7, an electronic element 305 in the fifth embodiment has its leg parts 45 provided as plural, intermittent leg parts 45, in which each of the leg parts 45 is formed as a separate part from the molded side part 48. In other words, the electronic element 305 in the fifth embodiment is formed as a combination of (i) the electronic element 309 of the comparative example in FIG. 8 and (ii) the separately-formed leg parts 45 glued thereon by using a glue 7 or the like.

As practically shown in the above, the leg part may be any part that is configured to interpose between the molded side part 48 and the heat reception surface 63 of the heat sink 6, which is not only a leg part in one-body mold structure with the molded side part 48 but also other structures as long as the structure securely reserves an insulation gap/distance between the back electrode 36 and the heat reception surface 63.

Other Embodiments (A) In the description of the above-mentioned embodiment, for the ease of understanding, a focus of the description is put on one electronic element 301 among other elements and components that are all surface-mounted on the substrate 2 of the electronic device 10.

However, it is not necessary for all other elements and components to have the same leg part structure of the present disclosure. That is, two or more MOSFETS and other components surface-mounted on one substrate 2 need not have the leg part structure characterized in the present disclosure.

For example, when three electronic elements having the same height are arranged in a row between two support parts 64 of the heat sink 6, effects of warping of the substrate 2 are more severe for a center element than the other two elements that are closer to respective support parts 64. Therefore, the center element may have the leg part structure of the present disclosure, and the other two elements may have the conventional leg-less structure. Such an arrangement of the three electronic elements in a row corresponds to a recitation in the claim "the electronic element in any one of claims 1 to x".

(B) The electronic element of the present disclosure is not only MOSFET, but also any surface-mountable heat generating electronic element such as IGBT, a semiconductor switching element, i.e., a transistor, as well as a thyristor, IC, an integrated IC, i.e., a microcomputer, and the like. The claim elements such as "a substrate side conductor part" and "a backside conductor part", which correspond respectively to the drain terminal 35 and the source electrode 36 in the above embodiment, may have different names in those various semiconductor switching elements. Further, a part corresponding to the source element 37 in the above embodiment may be omissible.

(C) An "insulation heat dissipater" may include, beside the heat dissipation gel 5, "heat transfer grease" disclosed in JP-A-2011-71550 or the like, for example.

(D) The support part which supports the substrate above the heat reception surface of the heat sink at a predetermined distance in a mutually facing manner may be not only an integral part formed in a boss shape to protrude from the heat sink, but also a separate part such as a spacer or the like.

(E) The electronic element of the present disclosure may be not only a drive circuit of a steering assist motor in an electric power steering device, but also any electronic device that includes (i) a heat dissipation structure for dissipating heat from a backside conductor part of a surface-mounted electronic element to a heat sink and (ii) a substrate that is susceptible to warping.

Although the present disclosure has been fully described in connection with the preferred embodiment thereof with reference to the accompanying drawings, it is to be noted that various changes and modifications will become apparent to those skilled in the art, and such changes and modifications are to be understood as being within the scope of the present disclosure as defined by the appended claims.

What is claimed is:

1. An electronic element surface-mounted on a substrate, the electronic element comprising:
   a chip;
   a substrate side conductor part disposed on a substrate side of the chip in electrical contact with the substrate;
   a backside conductor part disposed on an opposite side of the chip relative to the substrate side conductor part, and exposing a back surface thereof which is opposite to the substrate side conductor part;
   a molded side part covering a side face of the chip, the substrate side conductor part, and the backside conductor part; and
   plural leg parts disposed on a peripheral portion of the backside conductor part and protruding from the peripheral portion of the backside conductor part in a direction away from the substrate side conductor part, wherein
   the plural leg parts are formed to protrude intermittently from the molded side part on plural corners and to protrude from a center of the backside electrode part between at least two of the plural corners of the backside conductor part, along the peripheral portion of the backside conductor part, while leaving an interior portion of the back surface of the backside conductor part exposed.

2. The electronic element of claim 1, wherein the leg part is integrally molded from resin as one-body with the molded side part.

3. The electronic element of claim 1, wherein the leg parts and the molded side part are formed as a one-body resin mold.

4. An electronic device comprising:
   a heat sink having a heat reception surface;
   a substrate having a mounting surface on one side of the substrate which faces the heat reception surface, the substrate supported by plural supporters so that a mounting surface is positioned at a predetermined height from the heat reception surface of the heat sink;
   at least one electronic element surface-mounted on the substrate, the at least one electronic element including
      a chip,
      a substrate side conductor part disposed on a substrate side of the chip in electrical contact with the substrate,
      a backside conductor part disposed on an opposite side of the chip relative to the substrate side conductor part, and exposing a back surface thereof which is opposite to the substrate side conductor part,
      a molded side part covering a side face of the chip, the substrate side conductor part, and the backside conductor part, and
      plural leg parts disposed on a peripheral portion of the backside conductor part and protruding from the peripheral portion of the backside conductor part in a direction away from the substrate side conductor part,
      the at least one electronic element being surface-mounted on the substrate with the substrate side conductor part connected to the substrate and the back surface of the backside conductor part facing the heat reception surface of the heat sink; and
   an insulation heat dissipater filled within a space between the backside conductor part and the heat reception surface of the heat sink and transmitting heat generated by the electronic element to the heat sink, wherein
   the plural leg parts are formed to protrude intermittently from the molded side part on plural corners and to protrude from a center of the backside electrode part between at least two of the plural corners of the backside conductor part, along the peripheral portion of the backside conductor part, while leaving an interior portion of the back surface of the backside conductor part exposed.

5. The electronic device of claim 4, wherein the electronic device is installed in a motor drive circuit that drives a motor that outputs a steering assist torque in an electric power steering apparatus of a vehicle.

6. The electronic element of claim 4, wherein the leg parts and the molded side part are formed as a one-body resin mold.

7. The electronic element of claim 4, wherein the insulation heat dissipater also fills a space between the bottom sides of each of the plural leg parts and the heat reception surface of the heat sink.

8. An electronic element surface-mounted on a substrate, the electronic element comprising:
   a chip;
   a substrate side conductor part disposed on a substrate side of the chip in electrical contact with the substrate;
   a backside conductor part disposed on an opposite side of the chip relative to the substrate side conductor part, and exposing a back surface thereof which is opposite to the substrate side conductor part;
   a molded side part covering a side face of the chip, the substrate side conductor part, and the backside conductor part; and
   a leg part disposed on a peripheral portion of the backside conductor part and protruding from the peripheral portion of the backside conductor part in a direction away from the substrate side conductor part, wherein
   the leg part is formed in a shape of a continuous wall formed as a one-body resin mold as part of the molded side part that protrudes from the molded side part along all sides of the peripheral portion of the backside conductor part, while leaving an interior portion of the back surface of the backside conductor part exposed.

9. The electronic element of claim 8, wherein the continuous wall extends along all surrounding sides of the peripheral portion.

10. An electronic element surface-mounted on a substrate, the electronic element comprising:
    a chip;
    a substrate side conductor part disposed on a substrate side of the chip in electrical contact with the substrate;
    a backside conductor part disposed on an opposite side of the chip relative to the substrate side conductor part, and exposing a back surface thereof which is opposite to the substrate side conductor part;
    a molded side part covering a side face of the chip, the substrate side conductor part, and
    the backside conductor part; and
    leg parts disposed on a peripheral portion of the backside conductor part and protruding from the peripheral portion of the backside conductor part in a direction away from the substrate side conductor part, wherein the leg parts are formed intermittently as a one-body resin mold as part of the molded side part on each of four corners of the backside conductor part, and at a center portion of the backside electrode part between each of the four corners of the backside conductor part along the peripheral portion of the backside conductor part, while leaving an interior portion of the back surface of the backside conductor part exposed; and
    the interior portion of the backside electrode part is provided between each of the four corners support the substrate on the substrate side of the chip from warping into a heat sink on the opposite side of the chip.

* * * * *